(12) United States Patent
Wang et al.

(10) Patent No.: US 12,484,371 B2
(45) Date of Patent: Nov. 25, 2025

(54) LIGHT EMITTING DEVICE AND FABRICATING METHOD THEREOF, AND LIGHT EMITTING APPARATUS

(71) Applicants: Beijing BOE Technology Development Co., Ltd., Beijing (CN); BOE Technology Group Co., Ltd., Beijing (CN)

(72) Inventors: Tieshi Wang, Beijing (CN); Zhuo Chen, Beijing (CN); Zhuo Li, Beijing (CN); Xu Yuan, Beijing (CN); Di Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/921,087

(22) PCT Filed: Dec. 15, 2021

(86) PCT No.: PCT/CN2021/138181
§ 371 (c)(1),
(2) Date: Oct. 24, 2022

(87) PCT Pub. No.: WO2023/108456
PCT Pub. Date: Jun. 22, 2023

(65) Prior Publication Data
US 2024/0224559 A1 Jul. 4, 2024

(51) Int. Cl.
*H10K 50/115* (2023.01)
*C09K 11/06* (2006.01)
(Continued)

(52) U.S. Cl.
CPC ............ *H10K 50/115* (2023.02); *C09K 11/06* (2013.01); *H10K 59/35* (2023.02); *H10K 71/15* (2023.02);
(Continued)

(58) Field of Classification Search
CPC .............................................. H10K 50/11–135
See application file for complete search history.

(56) References Cited

U.S. PATENT DOCUMENTS

| | | | |
|---|---|---|---|
| 2019/0049777 A1* | 2/2019 | Li | G02F 1/133512 |
| 2020/0028090 A1* | 1/2020 | Zhang | H10K 50/11 |

(Continued)

FOREIGN PATENT DOCUMENTS

| | | |
|---|---|---|
| CN | 110590549 A | 12/2019 |
| CN | 110771263 A | 2/2020 |

(Continued)

*Primary Examiner* — Christine S. Kim
*Assistant Examiner* — Cole Leon Lindsey
(74) *Attorney, Agent, or Firm* — IPro, PLLC (57) ABSTRACT

A light emitting device and a fabricating method thereof, and a light emitting apparatus. The light emitting device includes: a substrate, and an assisting layer and a quantum-dot layer that are provided in stack on one side of the substrate, and the assisting layer is close to the substrate; a material of the assisting layer includes a non-polar polymer; and the quantum-dot layer includes quantum dots and a first ligand material coordinated to the quantum dots, and a property of the first ligand material changes by an effect of illumination, so that a solubility of the quantum-dot layer in an organic solvent changes.

15 Claims, 5 Drawing Sheets

(51) Int. Cl.
  *H10K 59/35* (2023.01)
  *H10K 71/15* (2023.01)
  *H10K 85/10* (2023.01)

(52) U.S. Cl.
  CPC ......... *H10K 85/141* (2023.02); *H10K 85/151* (2023.02)

(56) References Cited

U.S. PATENT DOCUMENTS

2020/0136075 A1* 4/2020 Kanehiro ............. H10K 50/115
2021/0388259 A1   12/2021 Mei et al.
2022/0127525 A1   4/2022 Wang

FOREIGN PATENT DOCUMENTS

| CN | 111900269 A | 11/2020 |
| CN | 112086563 A | 12/2020 |
| CN | 112300784 A | 2/2021 |
| CN | 113690378 A | 11/2021 |

\* cited by examiner

LIGHT EMITTING DEVICE AND FABRICATING METHOD THEREOF, AND LIGHT EMITTING APPARATUS

TECHNICAL FIELD

The present disclosure relates to the technical field of semiconductors and more particularly, to a light emitting device and a fabricating method thereof, and a light emitting apparatus.

BACKGROUND

Quantum-dot Light Emitting Diodes (QLED) have a narrower emission spectrum, purer displaying colors, and a wider color gamut. Therefore, QLEDs have been paid much attention in the industry, and have become a competitive candidate for the next generation of displaying techniques.

SUMMARY

The present disclosure provides a light emitting device, wherein the light emitting device includes: a substrate, and an assisting layer and a quantum-dot layer that are provided in stack on one side of the substrate, and the assisting layer is close to the substrate;
 a material of the assisting layer includes a non-polar polymer; and
 the quantum-dot layer includes quantum dots and a first ligand material coordinated to the quantum dots, and a property of the first ligand material changes by an effect of illumination, so that a solubility of the quantum-dot layer in an organic solvent changes.

In an alternative implementation, the material of the assisting layer includes polyolefin.

In an alternative implementation, the first ligand material includes a copolymer obtained by oligomerization or copolymerization of any one or more of a monoolefin compound, a diolefin compound and a cycloolefin, and the first ligand material is provided with a functional group coordinated to the quantum dots.

In an alternative implementation, the first ligand material includes at least one of 2-propylen-1-thiol, isopentenylthiol, N,N-methylene-bis-acrylamide, 1,6-hexanediol diacrylate and diallyl sulfide.

In an alternative implementation, a thickness of the assisting layer is greater than or equal to 1 nm, and less than or equal to 50 nm.

In an alternative implementation, the light emitting device is an electroluminescent device, and the light emitting device further includes: a first electrode provided between the substrate and the assisting layer, and a second electrode provided on one side of the quantum-dot layer that is away from the assisting layer.

In an alternative implementation, the light emitting device further includes at least one of an electron transporting layer, a hole transporting layer and a hole injection layer; and
 a work function of the first electrode is less than or equal to a work function of the second electrode, the electron transporting layer is provided between the first electrode and the assisting layer, the hole transporting layer and the hole injection layer are provided in stack between the quantum-dot layer and the second electrode, and the hole injection layer is close to the second electrode; or
 a work function of the first electrode is greater than or equal to a work function of the second electrode, the hole injection layer and the hole transporting layer are provided in stack between the first electrode and the assisting layer, the hole transporting layer is close to the assisting layer, and the electron transporting layer is provided between the quantum-dot layer and the second electrode.

The present disclosure provides a light emitting apparatus, wherein the light emitting apparatus includes the light emitting device according to any one of the above embodiments.

The present disclosure provides a fabricating method of a light emitting device, wherein the fabricating method includes:
 providing a substrate;
 forming an assisting layer on one side of the substrate, wherein a material of the assisting layer includes a non-polar polymer; and
 forming a quantum-dot layer on one side of the assisting layer that is away from the substrate, wherein the quantum-dot layer includes quantum dots and a first ligand material coordinated to the quantum dots, and a property of the first ligand material changes by an effect of illumination, so that a solubility of the quantum-dot layer in an organic solvent changes.

In an alternative implementation, the step of forming the assisting layer on one side of the substrate includes:
 providing a first solution of the non-polar polymer; and
 spin-coating, spray-coating or blade-coating the first solution on one side of the substrate, to form the assisting layer.

In an alternative implementation, the step of forming the assisting layer on one side of the substrate includes:
 by using an in-situ-polymerization process, forming the assisting layer on one side of the substrate.

In an alternative implementation, the step of, by using the in-situ-polymerization process, forming the assisting layer on one side of the substrate includes:
 providing a second solution in which a monomer of the non-polar polymer and a first photoinitiator are mixed;
 spin-coating, spray-coating or blade-coating the second solution on one side of the substrate; and
 performing sequentially annealing treatment and exposure treatment to the second solution on the one side of the substrate, to form the assisting layer.

In an alternative implementation, the step of forming the quantum-dot layer on the one side of the assisting layer that is away from the substrate includes:
 mixing uniformly the quantum dots coordinated to the first ligand material and a second photoinitiator, to obtain a third solution;
 spin-coating, spray-coating or blade-coating the third solution on the one side of the assisting layer that is away from the substrate, to obtain a quantum-dot thin film, wherein the quantum-dot thin film includes a reservation region and a removal region;
 by using a mask, performing exposure treatment to the quantum-dot thin film, wherein the mask includes a light transmitting region and a light shielding region, the light transmitting region corresponds to the reservation region, and the light shielding region corresponds to the removal region; and
 by using a developer, performing development treatment to the quantum-dot thin film obtained after the exposure treatment, to obtain the quantum-dot layer.

In an alternative implementation, before the step of mixing uniformly the quantum dots coordinated to the first ligand material and the second photoinitiator, the method further includes:

provide quantum dots coordinated to a second ligand material; and performing a ligand exchanging reaction between the quantum dots coordinated to the second ligand material and the first ligand material, to obtain the quantum dots coordinated to the first ligand material.

In an alternative implementation, the organic solvent includes toluene and/or chloroform.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly described below. Apparently, the figures that are described below are embodiments of the present disclosure, and a person skilled in the art can obtain other figures according to these figures without paying creative work. It should be noted that the proportions in the drawings are merely illustrative and do not indicate the actual proportions.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In the drawings, in order for clarity, the thicknesses of the layers, the films, the panels, the regions and so on are exaggerated. The exemplary embodiments are described with reference to the cross-sectional views of the schematic diagrams as idealized embodiments herein. Accordingly, deviations from the shapes of the figures as the result of, for example, fabricating techniques and/or tolerances can be predicted. Therefore, the embodiments described herein should not be interpreted as limited to the particular shapes of the regions shown herein, but should include the deviations in terms of the shapes caused by, for example, fabrication. For example, a region illustrated or described as flat may typically have a rough and/or nonlinear feature. Moreover, an illustrated sharp angle may be rounded. Therefore, the regions shown in the drawings are essentially illustrative, and their shapes are not intended to illustrate the accurate shapes of the regions, and are not intended to limit the scopes of the claims.

As used herein, the term "and/or" includes any one of and all of the combinations of one or more of the related listed items. As can be further understood, the term "include" or "comprise", when used in this specification, indicates the existence of the stated feature, region, entirety, step, operation, element and/or component, but does not exclude the existence or addition of one or more other features, regions, entireties, steps, operations, elements, components and/or combinations thereof.

Quantum dots are a semiconductor nanocrystal, and thus cannot be deposited by vapor deposition. The solubility of quantum dots enables them to have the characteristic of solution processing, and therefore a quantum-dot thin film may be formed by using solution manufacture procedures such as spin coating, ink-jet printing and brush coating.

Currently, ink-jet printing is the QLED patterning process that is paid the most attention, and multiple types of ink-jet-printing QLED prototypes have already been issued in the market. However, the ink-jet printing of QLED devices has a low efficiency, mainly because the employment of ink-jet printing requires fabricating a pixel defining layer in advance, and the ink of the ink-jet printing has the problem of grade climbing on the pixel defining layer, which highly affects the morphology and the thickness uniformity of the quantum-dot thin film. Moreover, as restricted by the precision and the stability of the ink-jet-printing devices, ink-jet printing cannot fabricate high-resolution quantum-dot light emitting devices, which restricts its application in small-size high-resolution display products.

Figure 1:
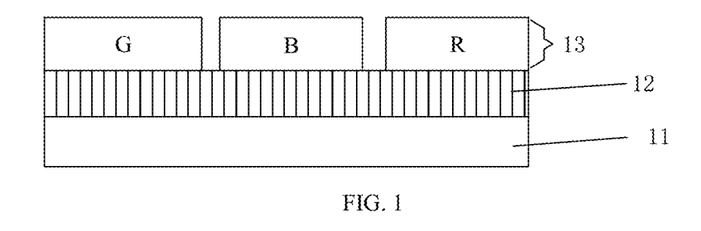
FIG. 1 schematically shows a schematic sectional structural diagram of a light emitting device.

An embodiment of the present disclosure provides a light emitting device, wherein the light emitting device includes: a substrate 11, and an assisting layer 12 and a quantum-dot layer 13 that are provided in stack on one side of the substrate 11, and the assisting layer 12 is close to the substrate 11.

The material of the assisting layer 12 includes a non-polar polymer. The quantum-dot layer 13 includes quantum dots and a first ligand material coordinated to the quantum dots, and the property of the first ligand material changes by the effect of illumination, so that the solubility of the quantum-dot layer 13 in an organic solvent changes.

The substrate 11 may, for example, be glass, a polyimide thin film, a silicon wafer and so on, which is not limited in the present disclosure.

The quantum-dot layer 13 includes quantum dots. The material of the quantum dots may include but is not limited to CdS, CdSe, ZnSe, InP, PbS, $CsPbCl_3$, $CsPbBr_3$, $CsPhI_3$, CdS/ZnS, CdSe/ZnS, InP/ZnS, PbS/ZnS, $CsPbCl_3$/ZnS, $CsPbBr_3$/ZnS, and $CsPhI_3$/ZnS.

In order to realize color light emission, as shown in FIG. 1, the quantum-dot layer 13 may include a red-color quantum dot R, a green-color quantum dot G and a blue-color quantum dot B. The red-color quantum dot R, the green-color quantum dot G and the blue-color quantum dot B are insulated from each other. In the practical structure, in order to prevent short circuiting between the red-color quantum dot R, the green-color quantum dot G and the blue-color quantum dot B, an insulating pixel defining layer (not shown in the figure) may be provided between the quantum dots of two neighboring sub-pixels, and the structure of the pixel defining layer may be configured according to practical demands.

The quantum-dot layer 13 further includes a first ligand material coordinated to the surface of the quantum dots. The property of the first ligand material changes by the effect of illumination. For example, under the irradiation of an ultraviolet light, the first ligand material may have interreaction to form a cross-linked net-like structure or have a degradation reaction, so that the solubility in an organic solvent of the quantum-dot layer 13 is increased or reduced after the illumination.

For example, in the patterning of the quantum-dot layer 13, an exposure process may be used to expose the to-be-reserved quantum dots, and block the to-be-removed quantum dots. During the exposure, the property of the first ligand material coordinated to the surface of the to-be-reserved quantum dots changes, so that the solubility of the to-be-reserved quantum dots in an organic solvent is reduced. In the subsequent development, because the to-be-removed quantum dots have a higher solubility in an organic solvent such as a developer, they may be removed in the development, while the to-be-reserved quantum dots have a lower solubility in the organic solvent, and are not dissolved by the developer. Therefore, a quantum-dot pattern may be formed after the development.

As another example, in the patterning of the quantum-dot layer 13, an exposure process may be used to expose the to-be-removed quantum dots, and block the to-be-reserved quantum dots. During the exposure, the property of the first ligand material coordinated to the surface of the to-be-removed quantum dots changes, so that the solubility of the to-be-removed quantum dots in an organic solvent is increased. In the subsequent development, because the to-be-removed quantum dots have a higher solubility in an organic solvent such as a developer, they may be removed in the development, while the to-be-reserved quantum dots have a lower solubility in the organic solvent, and are not dissolved by the developer. Therefore, a quantum-dot pattern may be formed after the development.

Optionally, the first ligand material may include a copolymer obtained by oligomerization or copolymerization of any one or more of a monoolefin compound, a diolefin compound and a cycloolefin. Particularly, the first ligand material may include but is not limited to a monoolefin compound such as 2-propylen-1-thiol and isopentenylthiol, and a diolefin compound such as N,N-methylene-bis-acrylamide, 1,6-hexanediol diacrylate and diallyl sulfide.

In order to be able to be coordinated to the quantum dots, the first ligand material may have a functional group coordinated to the quantum dots. For example, the first ligand material may further include one or more of functional groups such as alkene, alkyne, carbonyl, mercapto and hydroxyl.

The inventor has found that, in the patterning of the quantum-dot layer 13, the quantum dots within the to-be-removed region have the problem of remaining after development, which results in color mixing of the quantum dots in color light emitting devices, which reduces the color purity of QLED devices and the color gamut of display panels. In order to solve the problem, the quantum-dot layer 13 according to the present embodiment is provided on the assisting layer 12 whose material is a non-polar polymer.

Optionally, the material of the assisting layer 12 may include a non-polar polymer such as polyolefin and polytetrafluoroethylene. The material of the polyolefin is not limited in the present embodiment. For example, the polyolefin may be a copolymer obtained by oligomerization or copolymerization of α-olefins such as ethylene, propylene, 1-butylene, 1-pentene, 1-hexylene, 1-octylene and 4-methyl-1-pentene and cycloolefins.

Because the functional groups at the surface of the non-polar polymer have little polarity or no polarity, a smooth surface may be formed, the quantum-dot layer 13 is formed on the smooth surface of the assisting layer, and the smooth surface has a poor adsorbing force to the quantum dots, which facilitates to elute the quantum-dot material from the surface of the assisting layer 12 in the development, which may prevent the problem of quantum-dot remaining, and thus prevent the problem of color mixing caused by quantum-dot remaining.

The light emitting device according to the present embodiment may be a photoluminescent device or an electroluminescent device, may be of an uprightly placed device structure or an inversely placed device structure, and may be of a top-emission device structure or a bottom-emission device structure, which are not limited in the present disclosure.

Figure 2:
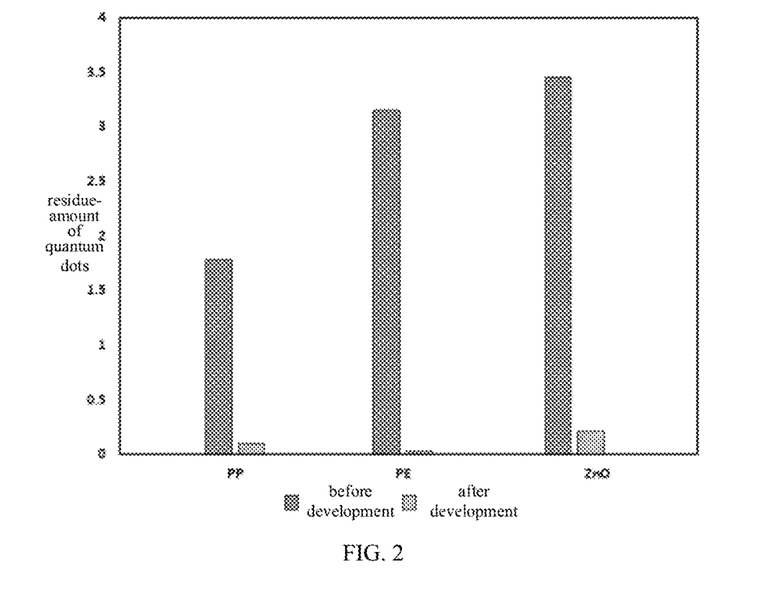
FIG. 2 schematically shows a schematic comparison diagram of the quantum-dot remaining of different assisting-layer materials.

Referring to FIG. 2, FIG. 2 compares the residue-amount data after, in the three cases in which the material of the assisting layer is individually polypropylene (PP), polyethylene (PE) and ZnO, spin-coating the quantum dots on the surface of the assisting layer and performing exposure and development to the quantum dots. It can be seen from FIG. 2 that, on the surface of the assisting layers whose material is polyolefin such as PE and PP, the quantum-dot remaining is significantly reduced, and, as compared with ZnO as the material, the residue amount of the quantum dots is reduced by 1-2 orders of magnitude.

Figure 3:
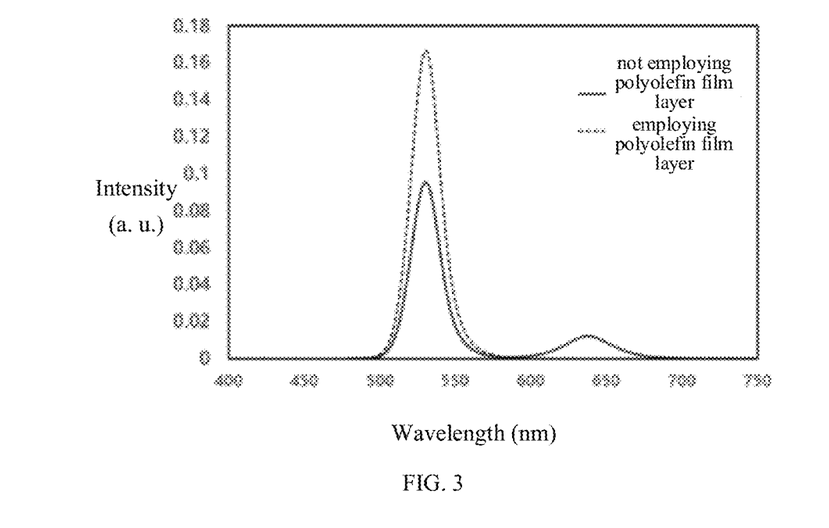
FIG. 3 schematically shows a schematic comparison diagram of the luminescence spectrums of two light emitting devices.

Referring to FIG. 3, FIG. 3 shows a schematic comparison diagram of the luminescence spectrums of two light emitting devices. The assisting layer of one of the light emitting devices employs a polyolefin material, and the assisting layer of the other light emitting device does not employ a polyolefin material. Both of the two light emitting devices are provided with a green-color quantum dot and a red-color quantum dot on the assisting layer by patterning. It can be seen from FIG. 3 that the luminescence spectrum of the green-color quantum dot fabricated on the assisting film layer employing the polyolefin material does not have the light-emission peak of the red-color quantum dot (as shown by the dotted line in FIG. 3), which indicates that the red-color quantum dot does not remain within the region of the green-color quantum dot, while the luminescence spectrum of the green-color quantum dot fabricated on the assisting film layer not employing the polyolefin material has the light-emission peak of the red-color quantum dot (as shown by the solid line in FIG. 3), which indicates that the red-color quantum dot remains within the region of the green-color quantum dot, which results in color mixing.

Figure 4:
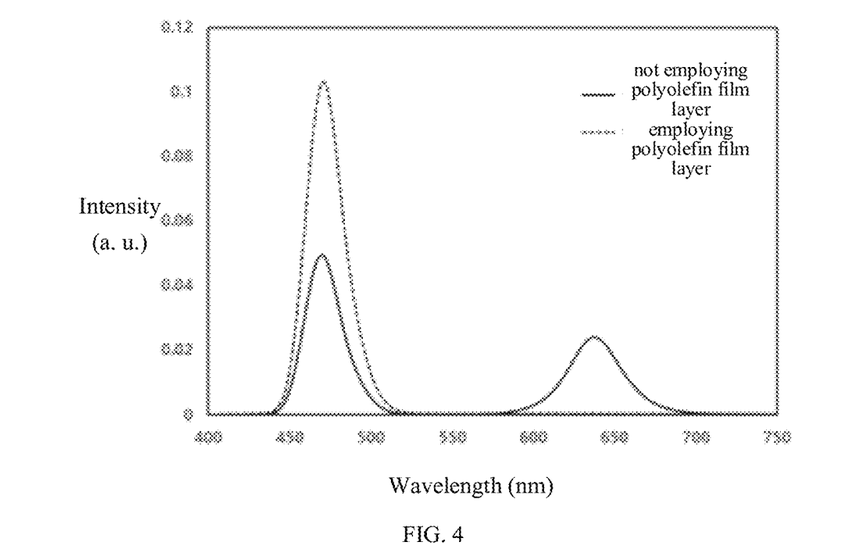
FIG. 4 schematically shows a schematic comparison diagram of the luminescence spectrums of another two light emitting devices.

Referring to FIG. 4, FIG. 4 shows a schematic comparison diagram of the luminescence spectrums of two light emitting devices. The assisting layer of one of the light emitting devices employs a polyolefin material, and the assisting layer of the other light emitting device does not employ a polyolefin material. Both of the two light emitting devices are provided with a blue-color quantum dot and a red-color quantum dot on the assisting layer by patterning. It can be seen from FIG. 4 that the luminescence spectrum of the blue-color quantum dot fabricated on the assisting film layer employing the polyolefin material does not have the light-emission peak of the red-color quantum dot (as shown by the dotted line in FIG. 4), which indicates that the red-color quantum dot does not remain within the region of the blue-color quantum dot, while the luminescence spectrum of the blue-color quantum dot fabricated on the assisting film layer not employing the polyolefin material has the light-emission peak of the red-color quantum dot (as shown by the solid line in FIG. 4), which indicates that the red-color quantum dot remains within the region of the blue-color quantum dot, which results in color mixing.

It can be seen from FIGS. 3 and 4 that the assisting layer, by using the polyolefin material, may effectively solve the problem of the quantum-dot remaining in the patterning of the quantum dots.

In the light emitting device according to the present embodiment, by providing the assisting layer of the polyolefin material on the substrate, the quantum-dot layer is directly formed on the assisting layer. Because the non-polar surface of the assisting layer may effectively reduce the adsorption to the quantum dots, the problem of remaining of the quantum-dot film layer in the development may be solved, to prevent color mixing, increase the color purity of the quantum-dot light emitting device, and increase the color gamut of the display panel. Furthermore, the light emitting device according to the present embodiment may be fabricated by using a patterning process of exposure and development, which may break through the restriction on the resolution by ink-jet printing, may satisfy the demand on high-resolution patterned quantum dots, and may realize a high-resolution QLED.

Optionally, the thickness of the assisting layer 12 may be greater than or equal to 1 nm, and less than or equal to 50 nm. For example, the thickness of the assisting layer 12 may be 10 nm, 20 nm and so on, which is not limited in the present disclosure.

Figure 5:
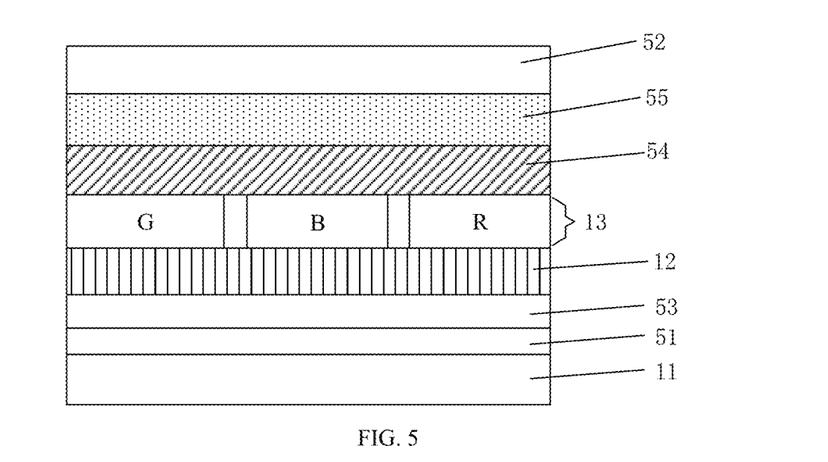
FIG. 5 schematically shows a schematic sectional structural diagram of an electroluminescent device.
Figure 6:
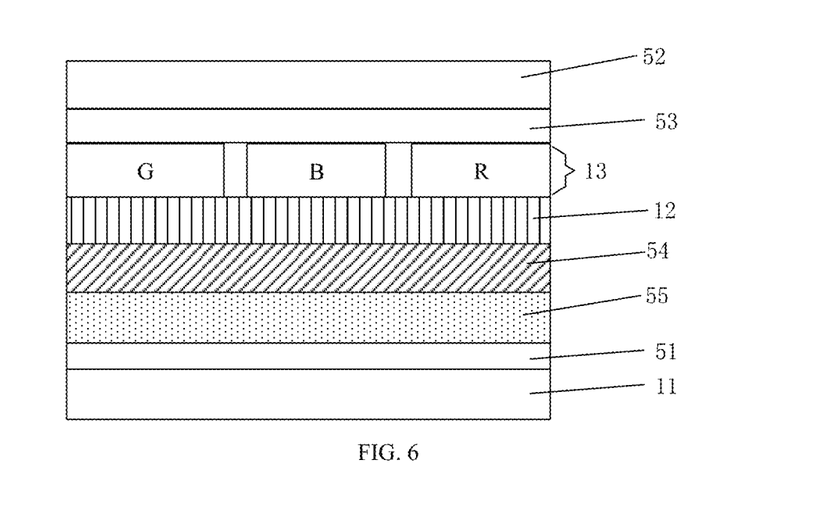
FIG. 6 schematically shows a schematic sectional structural diagram of another electroluminescent device.

In an alternative implementation, the light emitting device is an electroluminescent device. In order to realize the electroluminescence, as shown in FIGS. 5 and 6, the light emitting device may further include: a first electrode 51 provided between the substrate 11 and the assisting layer 12, and a second electrode 52 provided on the side of the quantum-dot layer 13 that is away from the assisting layer 12. The work functions of the first electrode 51 and the second electrode 52 may be equal or unequal, and the first electrode 51 and the second electrode 52 may be exchanged. The first electrode 51 may be a transmitting electrode or a half-transmitting reflecting electrode. If the first electrode 51 is a half-transmitting reflecting electrode or a reflecting electrode, the first electrode 51 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In one or more embodiments, the first electrode 51 may be of a multilayer structure, and includes a reflecting layer and/or a half-transmitting reflecting layer formed by using any of the materials described above, and a transparent electrically conductive layer formed by using indium tin oxide (ITO), indium zinc oxide (IZO), zinc oxide (ZnO), indium tin zinc oxide (ITZO) and so on. For example, the first electrode 51 may be multiple metal layers, and may have a laminated structure of ITO/Ag/ITO.

In order to increase the luminous efficiency of the electroluminescent device, as shown in FIGS. 5 and 6, the light emitting device may further include at least one of the following film layers: an electron transporting layer 53, a hole transporting layer 54 and a hole injection layer 55. The position configuration of those film layers, according to the types of the first electrode 51 and the second electrode 52, has multiple implementations.

In the first implementation, as shown in FIG. 5, the work function of the first electrode 51 is less than or equal to the work function of the second electrode 52. The first electrode 51 may be the cathode, and the second electrode 52 may be the anode. The electron transporting layer 53 is provided between the first electrode 51 and the assisting layer 12, the hole transporting layer 54 and the hole injection layer 55 are provided in stack between the quantum-dot layer 13 and the second electrode 52, and the hole injection layer 55 is close to the second electrode 52.

The light emitting device shown in FIG. 5 is of an inversely placed structure. By providing the assisting layer 12 between the electron transporting layer 53 and the quantum-dot layer 13, because the non-polar polymer in the assisting layer 12 such as polyolefin is insulative, the assisting layer 12 may serve to block electrons, and may regulate the transmission rate of the electrons, to enable the injection of the electrons and the holes in the quantum-dot layer 13 to be more balanced, which may improve the performance of the light emitting device.

In the second implementation, as shown in FIG. 6, the work function of the first electrode 51 is greater than or equal to the work function of the second electrode 52. The first electrode 51 may be the anode, and the second electrode 52 may be the cathode. The hole injection layer 55 and the hole transporting layer 54 are provided in stack between the first electrode 51 and the assisting layer 12, the hole transporting layer 54 is close to the assisting layer 12, and the electron transporting layer 53 is provided between the quantum-dot layer 13 and the second electrode 52.

The light emitting device shown in FIG. 6 is of an uprightly placed structure. By providing the assisting layer 12 between the quantum-dot layer 13 and the hole transporting layer 54, because the non-polar polymer in the assisting layer 12 such as polyolefin is insulative, the assisting layer 12 may serve to block electrons, and may regulate the transmission rate of the electrons, to enable the injection of the electrons and the holes in the quantum-dot layer 13 to be more balanced, which may improve the performance of the light emitting device.

The electron transporting layer 53 is mainly used for the transmission of the electrons, and its material may include but is not limited to zinc oxide, magnesium zinc oxide, aluminium zinc oxide, tin oxide and titanium oxide.

The hole transporting layer 54 is mainly used for the transmission of the holes, and its material may include but is not limited to an organic hole transmitting material such as CBP, NPB and TPD, and an inorganic hole transmitting material such as nickel oxide, tungsten oxide, molybdenum oxide, cuprous oxide and vanadium oxide.

The main function of the hole injection layer 55 is to reduce the hole injection barrier potential, and increase the hole injection efficiency. It may be fabricated by using materials such as PSS:PEDOT and NiOx, and may also be fabricated by P-type doping to a hole transmitting material.

The present disclosure further provides a light emitting apparatus, wherein the light emitting apparatus includes the light emitting device according to any one of the above embodiments.

A person skilled in the art may understand that the light emitting apparatus has the advantages of the light emitting device described above.

In some embodiments, the light emitting apparatus may be an illuminating device. In this case, the light emitting apparatus serves as a light source, to realize the function of illumination. For example, the light emitting apparatus may be a backlight module in a liquid-crystal displaying device, a lamp for internal illumination or external illumination, or various signal lamps.

In some other embodiments, the light emitting apparatus may be a displaying device. In this case, the light emitting device is used to realize the function of displaying images (i.e., frames). The light emitting apparatus may include a display or a product including a display. The display may be a Flat Panel Display (FPD), a microdisplay and so on. If classified based on whether the user may see the scene at the back face of the display, the display may be a transparent display or a non-transparent display. If classified based on whether the display may be bent or curled, the display may be a flexible display or a common display (which may be referred to as a rigid display). As an example, the product including a display may include: a computer display, a television set, a billboard, a laser printer having the function of displaying, a telephone, a mobile phone, an electronic paper, a Personal Digital Assistant (PDA), a laptop computer, a digital camera, a tablet personal computer, a notebook computer, a navigator, a portable camcorder, a viewfinder, a vehicle, a large-area wall, a theater screen, a stadium scutcheon and so on.

The present disclosure further provides a fabricating method of a light emitting device, wherein the fabricating method includes:

Step S1: providing a substrate.

Step S2: forming an assisting layer on one side of the substrate, wherein a material of the assisting layer includes a non-polar polymer.

Step S3: forming a quantum-dot layer on one side of the assisting layer that is away from the substrate, wherein the quantum-dot layer includes quantum dots and a first ligand material coordinated to the quantum dots, and a property of the first ligand material changes by an effect of illumination, so that a solubility of the quantum-dot layer in an organic solvent changes.

The fabricating method according to the present embodiment may be used to fabricate the light emitting device according to any one of the above embodiments.

In a particular implementation, the step S2 has multiple implementations. In the first implementation, the step S2 may include: providing a first solution of the non-polar polymer; and spin-coating, spray-coating or blade-coating the first solution on one side of the substrate, to form the assisting layer.

In order to obtain the first solution, a polyolefin material of a molecular weight between 500-5000 will be taken as an example below for the description. 100 mg of polypropylene particles of a molecular weight of 1000 are added into a 50 mL round-bottom flask, 20 mL of chlorobenzene is added, heating is performed to 80° C., and magnetic stirring is performed to formulate a 5 mg/mL polypropylene-chlorobenzene solution, i.e., the first solution. Subsequently, the first solution may be coated on one side of the substrate by spin coating, spray coating or blade coating, and, after the solvent has been removed, the assisting layer may be formed.

Regarding a polyolefin material whose melting point is lower than a tolerable temperature of the substrate, the first solution may be obtained by melting the polyolefin material, and the first solution may be coated on one side of the substrate by spin coating, spray coating or blade coating, whereby the assisting layer may be formed after solidification. Because the melting point of the polyolefin material is lower than the tolerable temperature of the substrate, the process of fabricating the assisting layer does not destroy the existing structure of the substrate.

In the second implementation, the step S2 may include: by using an in-situ-polymerization process, forming an assisting layer on one side of the substrate.

Particularly, this step may include firstly providing a second solution in which a monomer of the non-polar polymer and a first photoinitiator are mixed; subsequently, spin-coating, spray-coating or blade-coating the second solution on one side of the substrate; and subsequently, performing sequentially annealing treatment and exposure treatment to the second solution on the one side of the substrate, whereby the monomers of the non-polar polymer have a polymerization reaction, thereby forming the assisting layer.

The in-situ-polymerization process will be described below by taking the case as an example in which the monomer of the non-polar polymer is 4-methyl-1-pentene and the first photoinitiator is 2-hydroxyl-1,2-diphenylaceton. 100 mg of 4-methyl-1-pentene as the monomer, 1 mg of 2-hydroxyl-1,2-diphenylaceton as the first photoinitiator and 10 mL of toluene are sequentially added into a round-bottom flask, and are uniformly mixed to obtain a solution, i.e., the second solution. Subsequently, the second solution may be spin-coated on the surface of the substrate (for example, at a rotational speed of 1000 revolutions per minute). Subsequently, annealing treatment may be performed at 100° C. for 5 minutes, and subsequently UV exposure treatment is performed for 1 minute, whereby a compact poly(4-methyl-1-pentene) thin film may be formed at the surface of the substrate, i.e., the assisting layer.

Figure 7:
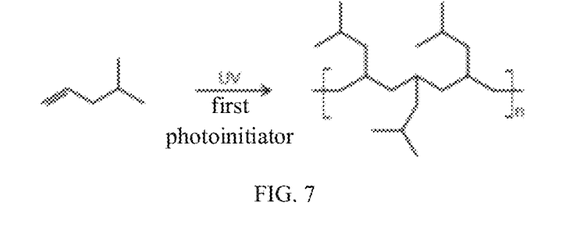
FIG. 7 schematically shows a schematic diagram of the principle of a process of forming poly(4-methyl-1-pentene)

Referring to FIG. 7, FIG. 7 shows a schematic diagram of the formation of poly(4-methyl-1-pentene) from a monomer of 4-methyl-1-pentene by the effect of UV illumination and the first photoinitiator.

In a particular implementation, the step S3 may include:

Step S01: mixing uniformly the quantum dots coordinated to the first ligand material and a second photoinitiator, to obtain a third solution;

Step S02: spin-coating, spray-coating or blade-coating the third solution on the one side of the assisting layer that is away from the substrate, to obtain a quantum-dot thin film, wherein the quantum-dot thin film includes a reservation region and a removal region;

Step S03: by using a mask, performing exposure treatment to the quantum-dot thin film, wherein the mask includes a light transmitting region and a light shielding region, the light transmitting region corresponds to the reservation region, and the light shielding region corresponds to the removal region; and Step S04: by using a developer, performing development treatment to the quantum-dot thin film obtained after the exposure treatment, to obtain the quantum-dot layer.

The organic solvent may, for example, include toluene and/or chloroform. In the present implementation, the developer may include toluene, or chloroform, or a mixed solution of toluene and chloroform.

In the present implementation, the first ligand material, by the effect of illumination, causes the solubility of the quantum-dot layer in an organic solvent to be reduced.

It should be noted that, if the first ligand material, by the effect of illumination, causes the solubility of the quantum-dot layer in an organic solvent to be increased, then the light shielding region corresponds to the reservation region, and the light transmitting region corresponds to the removal region.

In a particular implementation, in order to obtain the quantum dots coordinated to the first ligand material, this step may include firstly providing quantum dots coordinated to a second ligand material; and subsequently, performing a ligand exchanging reaction between the quantum dots coordinated to the second ligand material and the first ligand material, to obtain the quantum dots coordinated to the first ligand material.

The second ligand material may, for example, be oleic acid and oleylamine. In the present implementation, by using the ligand exchanging process, the second ligand material at the surface of the quantum dots is replaced by the first ligand material having light solidification or light degradation.

Figure 8:
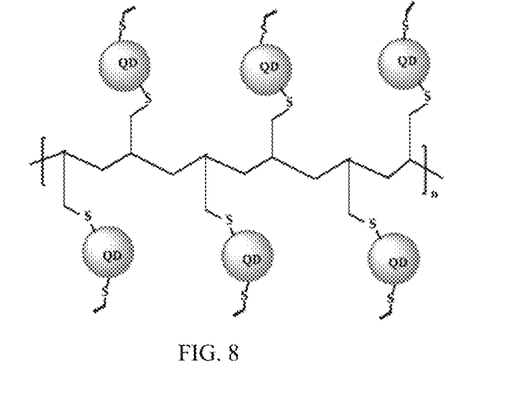
FIG. 8 schematically shows a schematic diagram of the cross-linked net-like structure formed by the quantum dots coordinated to 2-propylen-1-thiol formed by the effect of illumination.

The ligand exchanging process will be described below by taking the case as an example in which the first ligand material is 2-propylen-1-thiol and the second ligand material is oleic acid. In order to prevent oxidation of the materials, the ligand exchanging process of the quantum dots may be performed under a nitrogen atmosphere, and the process uses an anhydrous oxygen-free ultra-dry solvent. The particular process includes:

Firstly, by using a rotary evaporator, removing the solvent in the quantum dots (of a concentration of 30 mg/mL, 5 mL) coordinated to the oleic acid; subsequently, re-dissolving the quantum dots coordinated to the oleic acid by using 5 mL of chloroform, to obtain a quantum-dot solution; adding the quantum-dot solution into a 20 mL refluxing bottle equipped with magnetic stirring, heating to 65° C., subsequently, slowly dripping the chloroform solution of the 2-propylen-1-thiol ligand (of a concentration of 0.1 g/mL, 5 mL) into the quantum-dot solution in 3 batches at an interval of 1 hour, finally refluxing for 1 hour, finishing the reflection, and cooling to room temperature; and adding a proper amount of acetone into the reaction system, to settle the quantum dots, centrifuging, dissolving the precipitate with toluene, and subsequently circularly treating with acetone/toluene 3 times, to wash the residual oleic acid and un-coordinated ligand materials and so on at the surface of the quantum dots, to obtain the quantum dots coordinated to the 2-propylen-1-thiol, i.e., the quantum dots coordinated to the first ligand material. Referring to FIG. 8, FIG. 8 shows a schematic diagram of the cross-linked net-like structure formed by the quantum dots coordinated to 2-propylen-1-thiol formed by the effect of illumination.

In practical applications, the quantum dots coordinated to the first ligand material may be stored in a refrigerator at 0-5° C.

In order to obtain the third solution, 1-5% of a second photoinitiator such as diphenylketone may be added into the quantum dots coordinated to the first ligand material, and mixed uniformly, to obtain the third solution.

Figure 9:
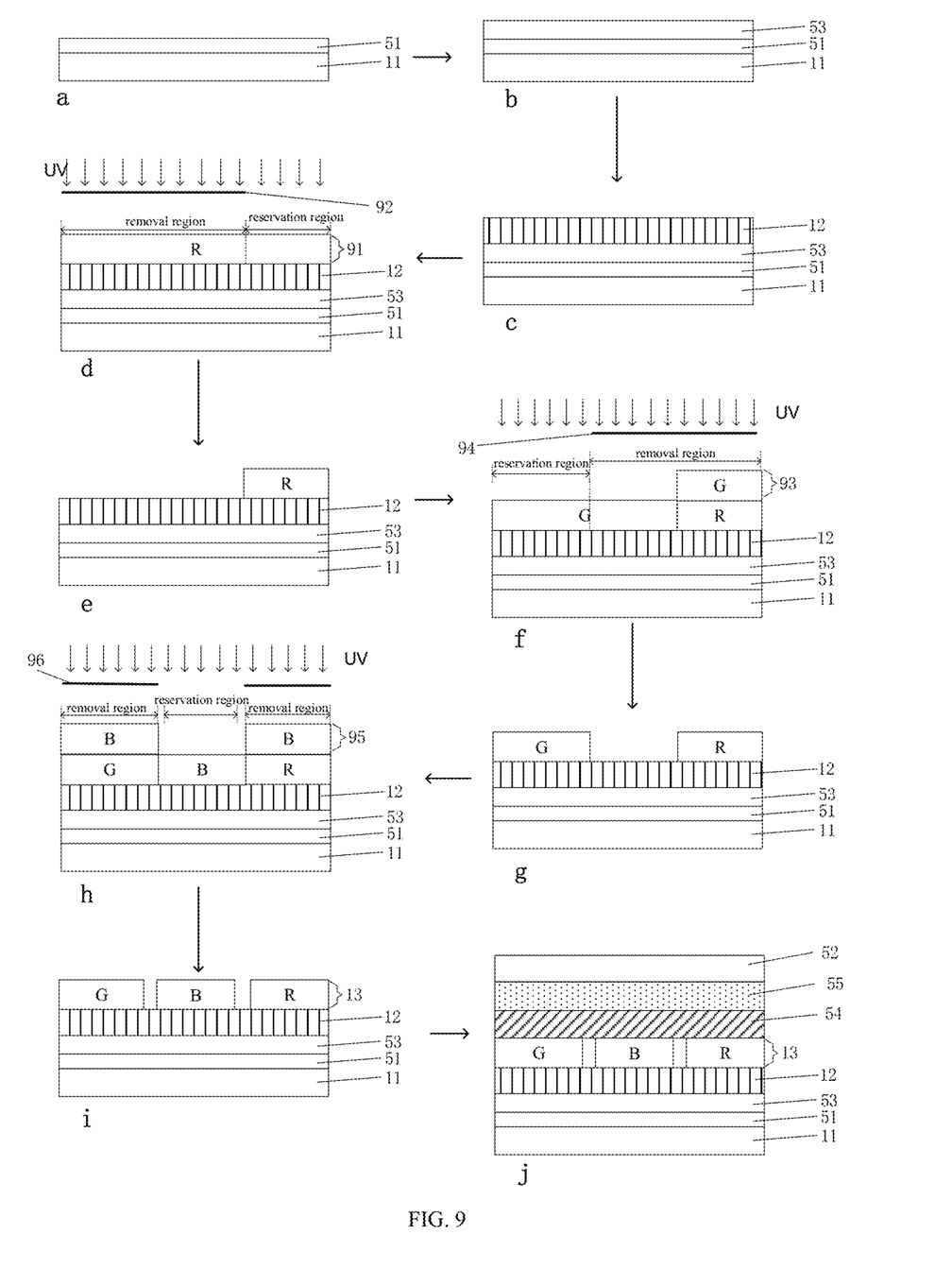
FIG. 9 schematically shows a schematic diagram of the process flow of a fabricating method of a light emitting device.

The fabricating method of a light emitting device according to the present embodiment will be described below by taking the fabrication of an inversely placed device structure as an example. The quantum-dot layer 13 in the light emitting device includes a red-color quantum dot R, a green-color quantum dot G and a blue-color quantum dot B. The method particularly includes the following steps:

Step S11: washing the base plate, wherein the base plate includes the substrate 11 and the first electrode 51, and the base plate is as shown in FIG. a in FIG. 9.

Step S12: forming an electron transporting layer 53 on the base plate by using a sputtering process or a sol-gel process, as shown in FIG. b in FIG. 9.

Step S13: forming an assisting layer 12 of the thickness of 10 nm on the surface of the electron transporting layer 53 that is away from the substrate 11, as shown in FIG. c in FIG. 9. Because the functional groups at the surface of the polyolefin have little polarity or no polarity, a smooth surface may be formed.

Step S14: forming a red-color-quantum-dot thin film 91 on the surface of the assisting layer 12 that is away from the substrate 11, wherein the red-color-quantum-dot thin film 91 includes a removal region and a reservation region, as shown in FIG. d in FIG. 9.

Step S15: as shown in FIG. d in FIG. 9, performing UV exposure to the red-color-quantum-dot thin film 91 by using a mask 92. After the red-color quantum dot located within the reservation region has been illuminated, the first ligand material in them has light solidification or light degradation, whereby the solubility in a developer of the red-color quantum dot located within the reservation region is reduced. However, the red-color quantum dot located within the removal region is not illuminated, and therefore the solubility in a developer of the red-color quantum dot located within the removal region is higher. The exposure duration may, for example, be 30 s. The exposure intensity may, for example, be 1-50 mw/cm$^{-2}$.

Step S16: performing development treatment to the red-color-quantum-dot thin film 91 that has been exposed by using a developer, to form a patterned red-color quantum dot R, as shown in FIG. e in FIG. 9. Because the red-color-quantum-dot thin film 91 is formed on the assisting layer 12 of a smooth surface, the assisting layer 12 has a poor adsorbing force to the red-color-quantum-dot thin film 91, which facilitates to elute the red-color quantum dot located within the removal region from the surface of the assisting layer 12 in the development, to prevent remaining of the red-color quantum dot. In the development, the developer may be toluene or chloroform, and the rotational speed of the substrate may be 3000 revolutions per minute.

Step S17: forming a green-color-quantum-dot thin film 93 on the surfaces of the assisting layer 12 and the red-color quantum dot R that are away from the substrate 11, wherein the green-color-quantum-dot thin film 93 includes a removal region and a reservation region, as shown in FIG. f in FIG. 9.

Step S18: as shown in FIG. f in FIG. 9, performing UV exposure to the green-color-quantum-dot thin film 93 by using a mask 94. After the green-color quantum dot located within the reservation region has been illuminated, the first ligand material in them has light solidification or light degradation, whereby the solubility in a developer of the green-color quantum dot located within the reservation region is reduced. However, the green-color quantum dot located within the removal region is not illuminated, and therefore the solubility in a developer of the green-color quantum dot located within the removal region is higher. The exposure duration may, for example, be 30 s. The exposure intensity may, for example, be 1-50 mw/cm$^{-2}$.

Step S19: performing development treatment to the green-color-quantum-dot thin film 93 that has been exposed by using a developer, to form a patterned green-color quantum dot G, as shown in FIG. g in FIG. 9. Because the green-color-quantum-dot thin film 93 is formed on the assisting layer 12 of a smooth surface, the assisting layer 12 has a poor adsorbing force to the green-color-quantum-dot thin film 93, which facilitates to elute the green-color quantum dot located within the removal region from the surface of the assisting layer 12 in the development, to prevent remaining of the green-color quantum dot. In the development, the developer may be toluene or chloroform, and the rotational speed of the substrate may be 3000 revolutions per minute.

Step S20: forming a blue-color-quantum-dot thin film 95 on the surfaces of the assisting layer 12, the red-color quantum dot R and the green-color quantum dot G that are away from the substrate 11, wherein the blue-color-quantum-dot thin film 95 includes a removal region and a reservation region, as shown in FIG. h in FIG. 9.

Step S21: as shown in FIG. h in FIG. 9, performing UV exposure to the blue-color-quantum-dot thin film 95 by using a mask 96. After the blue-color quantum dot located within the reservation region has been illuminated, the first ligand material in them has light solidification or light degradation, whereby the solubility in a developer of the blue-color quantum dot located within the reservation region is reduced. However, the blue-color quantum dot located within the removal region is not illuminated, and therefore the solubility in a developer of the blue-color quantum dot located within the removal region is higher. The exposure duration may, for example, be 30 s. The exposure intensity may, for example, be 1-50 mw/cm$^{-2}$.

Step S22: performing development treatment to the blue-color-quantum-dot thin film 95 that has been exposed by using a developer, to form a patterned blue-color quantum dot B, as shown in FIG. 1 in FIG. 9. Because the blue-color-quantum-dot thin film 95 is formed on the assisting layer 12 of a smooth surface, the assisting layer 12 has a poor adsorbing force to the blue-color-quantum-dot thin film 95, which facilitates to elute the blue-color quantum dot located within the removal region from the surface of the assisting layer 12 in the development, to prevent remaining of the blue-color quantum dot. In the development, the developer may be toluene or chloroform, and the rotational speed of the substrate may be 3000 revolutions per minute.

Step S23: by vapor deposition, forming sequentially the hole transporting layer 54, the hole injection layer 55 and the second electrode 52 on the side of the quantum-dot layer 13 that is away from the substrate 11, as shown in FIG. j in FIG. 9, to form the light emitting device.

The light emitting device fabricated by using the above-described method may prevent the problem of the quantum-dot remaining after the patterning, thereby improving the product quality and the displaying quality. The fabricating method is simple and easy to implement, and has a high operability.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The light emitting device and the fabricating method thereof, and the light emitting apparatus according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

A person skilled in the art, after considering the description and implementing the invention disclosed herein, will readily envisage other embodiments of the present disclosure. The present disclosure aims at encompassing any variations, uses or adaptative alternations of the present disclosure, wherein those variations, uses or adaptative alternations follow the general principle of the present disclosure and include common knowledge or common technical means in the art that are not disclosed by the present disclosure. The description and the embodiments are merely deemed as exemplary, and the true scope and spirit of the present disclosure are presented by the following claims.

It should be understood that the present disclosure is not limited to the accurate structure that has been described above and shown in the drawings, and may have various modifications and variations without departing from its scope. The scope of the present disclosure is merely limited by the appended claims.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A light emitting device, wherein the light emitting device comprises: a substrate, and an assisting layer and a quantum-dot layer that are provided in a stack on one side of the substrate, and the assisting layer is close to the substrate;
   a material of the assisting layer comprises a non-polar polymer; and
   the quantum-dot layer comprises quantum dots and a first ligand material coordinated to the quantum dots, and a property of the first ligand material changes by an effect of illumination, so that a solubility of the quantum-dot layer in an organic solvent changes.

2. The light emitting device according to claim 1, wherein the material of the assisting layer comprises polyolefin.

3. The light emitting device according to claim 1, wherein the first ligand material comprises a copolymer obtained by oligomerization or copolymerization of any one or more of a monoolefin compound, a diolefin compound and a cycloolefin, and the first ligand material is provided with a functional group coordinated to the quantum dots.

4. The light emitting device according to claim 3, wherein the first ligand material comprises at least one of 2-propylen-1-thiol, isopentenylthiol, N,N-methylene-bis-acrylamide, 1,6-hexanediol diacrylate and diallyl sulfide.

5. The light emitting device according to claim 1, wherein a thickness of the assisting layer is greater than or equal to 1 nm, and less than or equal to 50 nm.

6. The light emitting device according to claim 1, wherein the light emitting device is an electroluminescent device, and the light emitting device further comprises: a first electrode provided between the substrate and the assisting layer, and a second electrode provided on one side of the quantum-dot layer that is away from the assisting layer.

7. The light emitting device according to claim 6, wherein the light emitting device further comprises an electron transporting layer, a hole transporting layer and a hole injection layer; and
   a work function of the first electrode is less than or equal to a work function of the second electrode, the electron transporting layer is provided between the first electrode and the assisting layer, the hole transporting layer and the hole injection layer are provided in a stack between the quantum-dot layer and the second electrode, and the hole injection layer is close to the second electrode; or
   a work function of the first electrode is greater than or equal to a work function of the second electrode, the hole injection layer and the hole transporting layer are provided in a stack between the first electrode and the assisting layer, the hole transporting layer is close to the assisting layer, and the electron transporting layer is provided between the quantum-dot layer and the second electrode.

8. A light emitting apparatus, wherein the light emitting apparatus comprises the light emitting device according to claim 1.

9. A fabricating method of a light emitting device, wherein the fabricating method comprises:
   providing a substrate;
   forming an assisting layer on one side of the substrate, wherein a material of the assisting layer comprises a non-polar polymer; and
   forming a quantum-dot layer on one side of the assisting layer that is away from the substrate, wherein the quantum-dot layer comprises quantum dots and a first ligand material coordinated to the quantum dots, and a property of the first ligand material changes by an effect of illumination, so that a solubility of the quantum-dot layer in an organic solvent changes.

10. The fabricating method according to claim 9, wherein the step of forming the assisting layer on one side of the substrate comprises:
    providing a first solution of the non-polar polymer; and
    spin-coating, spray-coating or blade-coating the first solution on one side of the substrate, to form the assisting layer.

11. The fabricating method according to claim 9, wherein the step of forming the assisting layer on one side of the substrate comprises:
    by using an in-situ-polymerization process, forming the assisting layer on one side of the substrate.

12. The fabricating method according to claim 11, wherein the step of, by using the in-situ-polymerization process, forming the assisting layer on one side of the substrate comprises:
    providing a second solution in which a monomer of the non-polar polymer and a first photoinitiator are mixed;
    spin-coating, spray-coating or blade-coating the second solution on one side of the substrate; and
    performing sequentially annealing treatment and exposure treatment to the second solution on the one side of the substrate, to form the assisting layer.

13. The fabricating method according to claim 9, wherein the step of forming the quantum-dot layer on the one side of the assisting layer that is away from the substrate comprises:
    mixing uniformly the quantum dots coordinated to the first ligand material and a second photoinitiator, to obtain a third solution;
    spin-coating, spray-coating or blade-coating the third solution on the one side of the assisting layer that is away from the substrate, to obtain a quantum-dot thin film, wherein the quantum-dot thin film comprises a reservation region and a removal region;
    by using a mask, performing exposure treatment to the quantum-dot thin film, wherein the mask comprises a light transmitting region and a light shielding region, the light transmitting region corresponds to the reservation region, and the light shielding region corresponds to the removal region; and by using a developer, performing development treatment to the quantum-dot thin film obtained after the exposure treatment, to obtain the quantum-dot layer.

14. The fabricating method according to claim 13, wherein before the step of mixing uniformly the quantum dots coordinated to the first ligand material and the second photoinitiator, the method further comprises:

providing quantum dots coordinated to a second ligand material; and performing a ligand exchanging reaction between the quantum dots coordinated to the second ligand material and the first ligand material, to obtain the quantum dots coordinated to the first ligand material.

15. The fabricating method according to claim 9, wherein the organic solvent comprises toluene and/or chloroform.

* * * * *